(12) United States Patent
Kwon et al.

(10) Patent No.: US 6,791,196 B2
(45) Date of Patent: Sep. 14, 2004

(54) SEMICONDUCTOR DEVICES WITH BONDING PADS HAVING INTERMETAL DIELECTRIC LAYER OF HYBRID CONFIGURATION AND METHODS OF FABRICATING THE SAME

(75) Inventors: Dong Whee Kwon, Kyunggi-do (KR); Jin Hyuk Lee, Seoul (KR); Yun Heub Song, Kyunggi (KR); Sa Yoon Kang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 174 days.

(21) Appl. No.: 10/198,001

(22) Filed: Jul. 17, 2002

(65) Prior Publication Data

US 2003/0102475 A1 Jun. 5, 2003

(30) Foreign Application Priority Data

Dec. 3, 2001 (KR) .......................................... 2001-75867

(51) Int. Cl.⁷ .......................... H01L 23/48; H01L 23/52; H01L 29/40
(52) U.S. Cl. .......................... 257/784; 257/786; 438/612
(58) Field of Search ................................. 257/784, 786, 257/750, 758, 781, 698; 438/612, 622

(56) References Cited

U.S. PATENT DOCUMENTS

| 5,502,337 A | | 3/1996 | Nozaki |
| 5,736,791 A | * | 4/1998 | Fujiki et al. ................. 257/781 |
| 5,923,088 A | | 7/1999 | Shiue et al. |
| 6,034,439 A | | 3/2000 | Teng et al. |
| 6,163,074 A | * | 12/2000 | Lee et al. ..................... 257/734 |
| 6,313,540 B1 | * | 11/2001 | Kida et al. ................... 257/784 |
| 6,444,295 B1 | * | 9/2002 | Peng et al. ................... 428/209 |
| 6,495,918 B1 | * | 12/2002 | Brintzinger ................. 257/758 |
| 6,522,021 B2 | * | 2/2003 | Sakihama et al. .......... 257/784 |
| 6,552,438 B2 | * | 4/2003 | Lee et al. ..................... 257/784 |
| 6,577,017 B1 | * | 6/2003 | Wong .......................... 257/786 |
| 6,633,087 B2 | * | 10/2003 | Ker et al. .................... 257/786 |
| 6,667,535 B2 | * | 12/2003 | Yang ........................... 257/529 |

* cited by examiner

Primary Examiner—Sheila V. Clark
(74) Attorney, Agent, or Firm—Marger Johnson & McCollom, P.C.

(57) ABSTRACT

Devices that have bonding pads, and methods for fabricating the same. The bonding pads have two conductive layers, and an intermediate layer between them. The intermediate layer has a hybrid configuration of a relatively large conductive plate section, and a mixed plugs/mesh section. The plugs/mesh section has conductive portions interspersed with non-conducting portions, with features that are relatively small in size. The hybrid configuration achieves a proper balance between the plate section for the main electrical contact, and the plugs/mesh section for support and additional current density.

45 Claims, 23 Drawing Sheets

Fig. 11

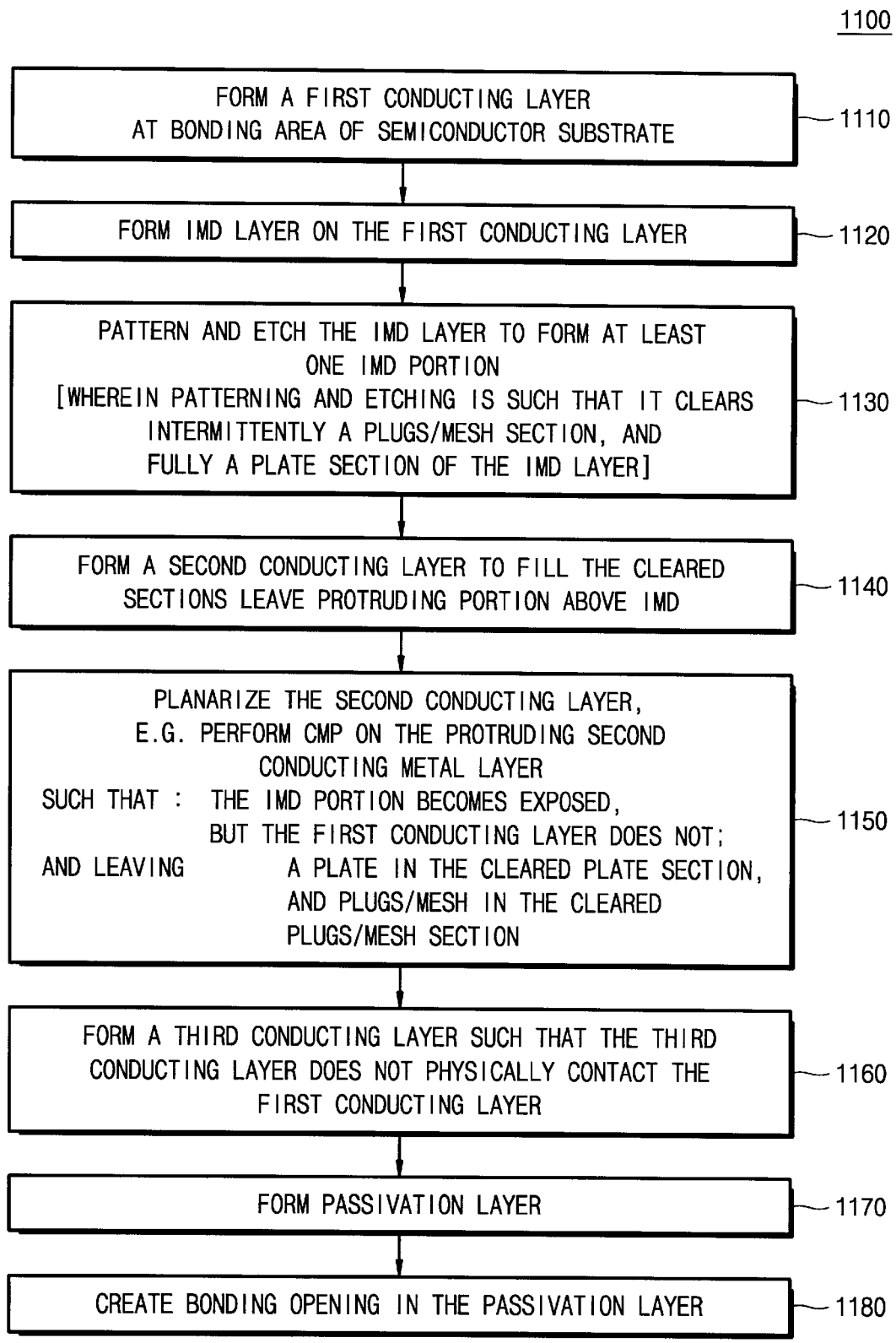

1100

1110 — FORM A FIRST CONDUCTING LAYER AT BONDING AREA OF SEMICONDUCTOR SUBSTRATE

1120 — FORM IMD LAYER ON THE FIRST CONDUCTING LAYER

1130 — PATTERN AND ETCH THE IMD LAYER TO FORM AT LEAST ONE IMD PORTION
[WHEREIN PATTERNING AND ETCHING IS SUCH THAT IT CLEARS INTERMITTENTLY A PLUGS/MESH SECTION, AND FULLY A PLATE SECTION OF THE IMD LAYER]

1140 — FORM A SECOND CONDUCTING LAYER TO FILL THE CLEARED SECTIONS LEAVE PROTRUDING PORTION ABOVE IMD

1150 — PLANARIZE THE SECOND CONDUCTING LAYER, E.G. PERFORM CMP ON THE PROTRUDING SECOND CONDUCTING METAL LAYER
SUCH THAT : THE IMD PORTION BECOMES EXPOSED, BUT THE FIRST CONDUCTING LAYER DOES NOT;
AND LEAVING  A PLATE IN THE CLEARED PLATE SECTION, AND PLUGS/MESH IN THE CLEARED PLUGS/MESH SECTION

1160 — FORM A THIRD CONDUCTING LAYER SUCH THAT THE THIRD CONDUCTING LAYER DOES NOT PHYSICALLY CONTACT THE FIRST CONDUCTING LAYER

1170 — FORM PASSIVATION LAYER

1180 — CREATE BONDING OPENING IN THE PASSIVATION LAYER

1460

SEMICONDUCTOR DEVICES WITH BONDING PADS HAVING INTERMETAL DIELECTRIC LAYER OF HYBRID CONFIGURATION AND METHODS OF FABRICATING THE SAME

CROSS REFERENCE TO RELATED APPLICATIONS

This application claims priority from Korean Priority Document No. 2001-0075867, filed on Dec. 3, 2001 with the Korean Industrial Property Office, which document is hereby incorporated by reference.

BACKGROUND OF THE INVENTION

1. Field of the Invention

The present invention is related to the field of bonding pads of semiconductor devices, and more specifically to semiconductor devices with bonding pads that have an intermetal dielectric layer of hybrid configuration, and methods of fabricating the same.

2. Description of the Related Art

Semiconductor devices include circuits. The circuits terminate in bonding pads, and are accessed through the bonding pads.

Referring now to FIG. 1A, a top surface of a bonding pad 100 in the prior art is shown. The bonding pad is accessed from the top surface. A dashed line 104 denotes a recess.

Referring now to FIG. 1B, a sectional view of pad 100 is shown. It is made with two conductive layers 114, 120, on a substrate 110. Layer 120 is typically made of aluminum, while layer 114 may be made from either aluminum or polycrystalline silicon.

FIG. 1B also shows the intended uses of bonding pad 100. First, after a device is initially fabricated, it is tested before packaging. Testing is called electrical die sorting (EDS), and is performed by moving an electrical lead 140 according to an arrow 142. Lead 140 is brought temporarily to contact the top surface of layer 120. Voltages are then applied and/or received through lead 140 for testing. After testing, lead 140 is withdrawn.

If the circuit is deemed acceptable after testing, then it is packaged. Prior to packaging, a bump 160 is deposited on, and attached to the top surface of layer 120. When the device will be in operation, then voltages are applied and/or received through bump 160. Alternately, instead of bump 160, a soldering wire (not shown) may be attached to the top surface of layer 120.

The device of FIG. 1B has problems. First, during fabrication, layer 120 may be subjected to a Chemical Mechanical Polishing (CMP) process. This can cause a dishing phenomenon, where a center portion may be polished away, thus exposing and subjecting layer 114 to damage. Second, when lead 140 is pressed upon bonding pad 100, it tends to scratch at least the top surface of layer 120.

Referring now to FIG. 2A, later bonding pads are described. In between layers 114, 120, there is an intermediate layer of rapidly alternating thin portions of inter-metal dielectric (IMD) 116 and tungsten (W) 118 along an intermediate plane 250. The portions of contacts 118 establish the electrical connection between lower conducting layer 114 and upper conducting layer 120. Two possible patterns of IMD 116 and W 118 in intermediate plane 250 are described below.

Referring to FIG. 2B, a pattern 250-A of IMD 116 and W 118 is contact-type. A grid of inter-metal dielectric 116 is fully permeated with openings, from which W contacts 118 emerge. In this case, W contacts 118 are also called W plugs 118.

Referring to FIG. 2C, a pattern 250-B of MD 116 and W 118 is mesh-type. A mesh of W 118 is fully permeated with openings, in which there are islands of inter-metal dielectric 116.

In the patterns 250-A and 250-B, the portions of dielectric 116 and W 118 are alternating rapidly throughout the intermediate layer, if considered along section lines. A relevant characteristic is that tungsten (W) is used in the intermediate layer, instead of aluminum. The reason is that the openings for it are very narrow, and becoming further narrower as integration of devices increases. Since the openings are narrow, using an aluminum flowing process to deposit aluminum could leave one or more voids in some of the openings. These voids would contribute to parasitic electrical resistance, which is why tungsten is preferred to aluminum.

In preparing a device according to FIG. 2A, FIG. 2B, FIG. 2C, a CMP process can be performed to remove any excess tungsten (W) that protrudes above the portions of intermetal dielectric 116. The portions of inter-metal dielectric 116 act as a stop to the CMP process. Their dense formation prevents any dishing phenomenon.

Bonding pad 200 has problems, some of which develop from the way that bonding pad 200 is tested and then packaged. These are discussed below.

Referring now to FIG. 3A, bonding pad 200 is shown being tested by lead 140. A hazard is that lead 140 may scratch off pieces of layer 120.

Referring now to FIG. 3B, a photograph of a top view of bonding pad 200 is shown, after being scratched as in FIG. 3A. Scratching exposes the IMD portions 116, which is undesirable.

Referring now to FIG. 3C, scratched bonding pad 200 is shown with a bump 260 being deposited and attached. Portions of a passivation layer 122 are also shown, which further guide where bump 260 would be located.

A problem in the scratched bonding pad of FIG. 3C is that bump 260 contacts layer 114 also through IMD portions 116. These provide weak adhesion of bump 260 to pad 200.

Referring now to FIG. 3D, due to the weak adhesion, bump 260 may be peeled off (lifted) entirely from bonding pad 200. In some instances, it may leave a residue 262.

In other words, if second metal pad 120 is damaged due to the probe pin, the intermetal dielectric (IMD) layer 116 as well as the tungsten plug 118 may be exposed. Since the IMD layer 116 is composed of oxide material, and oxide has poor adhesive force with a metal layer, bump 260 is frequently lifted due to the weak adhesion between the exposed IMD layer 116 and bump 260.

Referring now to FIG. 3E, a photograph of a top view of bonding pad 200 is shown, after bump 260 has been lifted as in FIG. 3D. Once the bump has been thus dislodged, the manufacturing yield is reduced.

Referring now to FIG. 4, another device 400 in the prior art is described, which is first taught in U.S. Pat. No. 6,034,439. The reference numerals have been adapted to match substantially corresponding numerals of the previous discussion. Layer 114 is made from polysilicon.

Device 400 comprises a first conductor 114 such as polysilicon layer, a large contact hole, and a plurality of small contact holes. The small contact holes are located around the large contact hole, metal spacers on the sidewalls of the large contact hole and the small contact holes, and a second conductor, such as aluminum.

Thus, aluminum pad 120 contacts directly polysilicon pad 114 through the large contact hole and the small contact holes. At this point, particles can be generated due to the tungsten spacer during the wet cleaning process applied prior to the formation of the aluminum pad. Therefore the yield of the device decreases due to the particles.

BRIEF SUMMARY OF THE INVENTION

The present invention overcomes these problems and limitations of the prior art.

Generally, the present invention provides devices that have bonding pads, and methods for fabricating the same. The bonding pads have two conductive layers, and an intermediate layer between them. The intermediate layer has a hybrid configuration of a relatively large conductive plate section, and a mixed plugs/mesh section. The plugs/mesh section has conductive portions interspersed with non-conducting portions, with features that are relatively small in size.

The hybrid configuration of the intermediate layer of the invention achieves a proper balance between the plate section for the main electrical contact, and the plugs/mesh section for support and additional current density. Indeed, the plate section is substantially larger than the average size of features in the plugs/mesh section. The plate is small enough to limit a dishing phenomenon in fabricating the plate section.

Even if a top layer is scratched, neither the non-conducting IMD layer, nor the lower layer are exposed. Only the metal plate will be exposed. And since it is metal, adhesion of the bump will not degraded.

The invention will become more readily apparent from the following Detailed Description, which proceeds with reference to the drawings, in which:

BRIEF DESCRIPTION OF THE DRAWINGS

FIG. 11 is a flowchart illustrating a fabrication method according to an embodiment of the present invention.

DETAILED DESCRIPTION OF THE PREFERRED EMBODIMENT(S)

As has been mentioned, the present invention provides devices that have bonding pads, and methods for fabricating the same. The bonding pads have two conductive layers, and an intermediate layer between them. The intermediate layer has a hybrid configuration of a conductive plate section and a mixed plugs/mesh section. The plugs/mesh section has conductive portions interspersed with non-conducting portions. The invention is now described in more detail.

Figure 5:
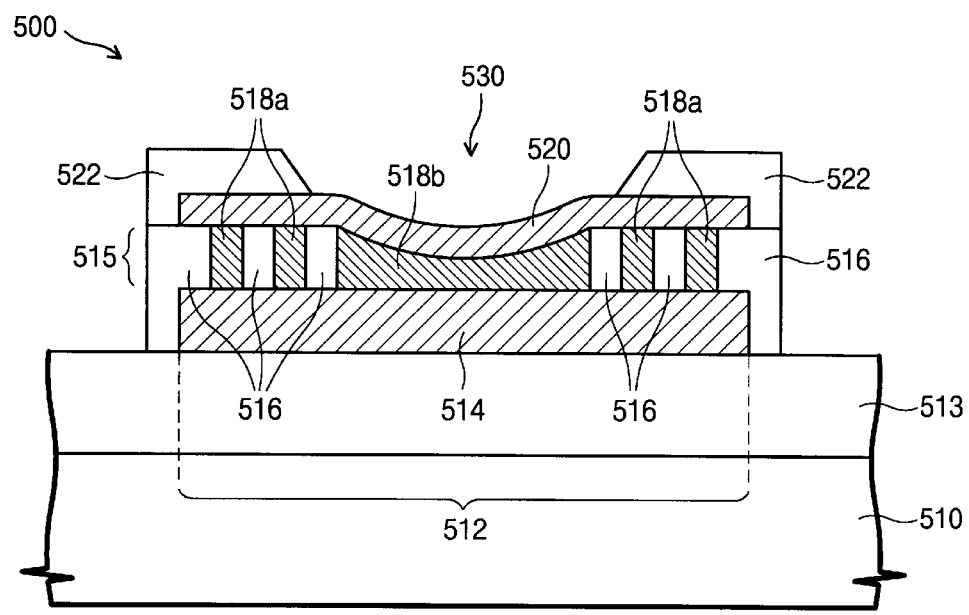
FIG. 5 is a section view of a device made according to an embodiment of the invention.

Referring now to FIG. 5, a device 500 made according to the invention is described. Device 500 has a semiconductor substrate 510, such as silicon. Substrate 510 has at least one bonding area 512 on its surface. The bonding pad is formed on bonding area 512.

A first conducting layer 514 is on bonding area 512. First conducting layer 514 is made from a conductive material, such as aluminum, polycrystalline silicon, etc.

Optionally, an interlayer dielectric (ILD) layer 513 is formed between substrate 510 and first conducting layer 514.

An intermediate layer 515 is on first conducting layer 514. Intermediate layer 515 includes at least one non-conducting part, shown as elements 516. Intermediate layer 515 also includes at least one conductive part, shown as elements 518a and 518b. As will be seen below, intermediate layer 515 has the hybrid configuration of the invention.

A top conductive layer 520 is on intermediate layer 515. Top conductive layer 520 does not physically contact first conducting layer 514. Top conductive layer 520 is made from a conductive material, such as aluminum.

Device 500 also includes a passivation layer 522, which has a bonding opening 530.

Figure 6A:
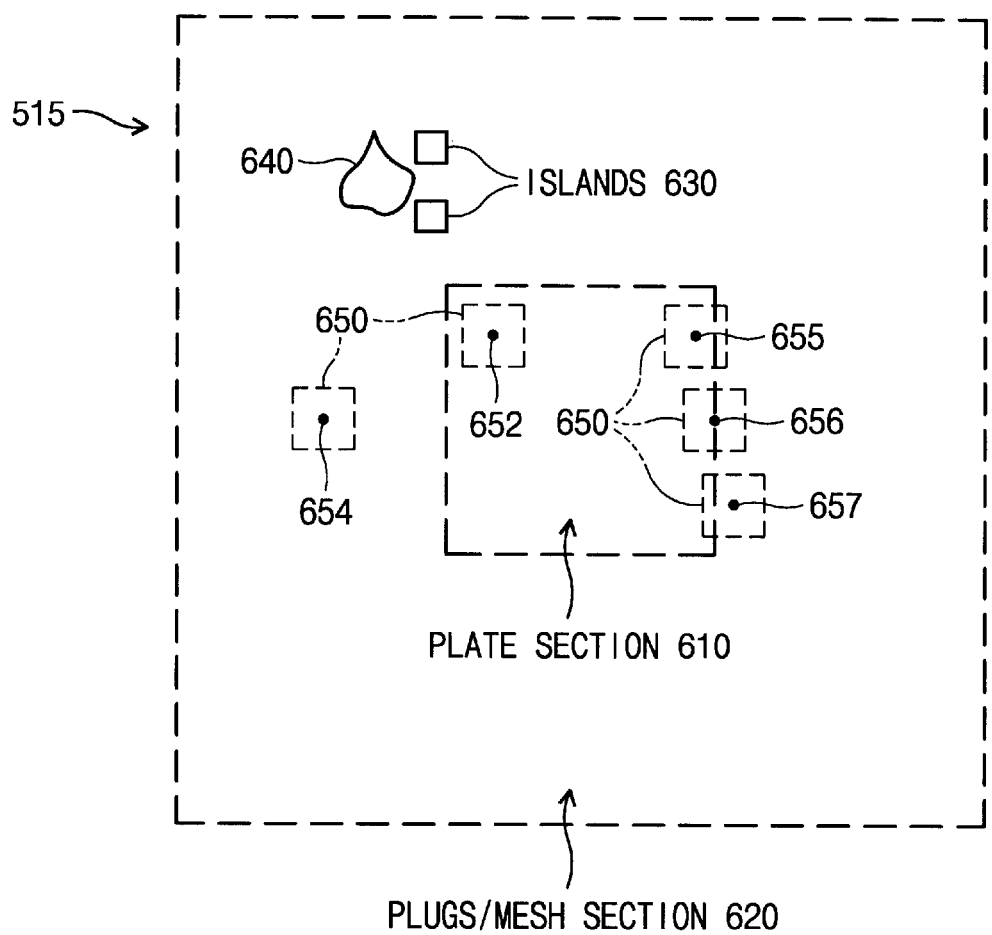
FIG. 6A is a planar view of an intermediate layer of the device of FIG. 5, illustrating a general hybrid configuration of the invention.

Referring now to FIG. 6A, a general view of intermediate layer 515 is described. Intermediate layer 515 defines at least one plate section 610, and a plugs/mesh section 620.

In intermediate layer 515, at every point there is either conductive part or non-conducting part. The conductive part is preferably made from either copper or tungsten. The non-conducting part is the dielectric layer, such as an oxide layer.

The non-conducting part and the conductive part are specially arranged in plate section 610 and plugs/mesh section 620 according to the invention. More particularly, plugs/mesh section 620 contains at least a plurality of islands 630 of either the conductive part or the non-conducting part. Plugs/mesh section 620 may also contain other features.

Islands 630 may be square in shape. Or they may have other shapes.

Each island 630 has an area. If they are all the same size, the average island area will equal the area of each.

Islands 630 are interspersed with at least one portion 640 of the other one of the conductive part the non-conducting part. In other words, if the islands are of the conductive part, then portion 640 is of the non-conducting part, and vice versa. Portion 640 may be a single large unit surrounding islands 630, or many smaller units.

In addition, plate section 610 contains fractionally more of the conductive part than plugs/mesh section 620. Conversely, plate section 610 contains fractionally less of the non-conducting part than plugs/mesh section 620. In both cases, the fractional content of the conductive part and of the non-conducting part equals one. This is described in more detail below.

Figure 6B:
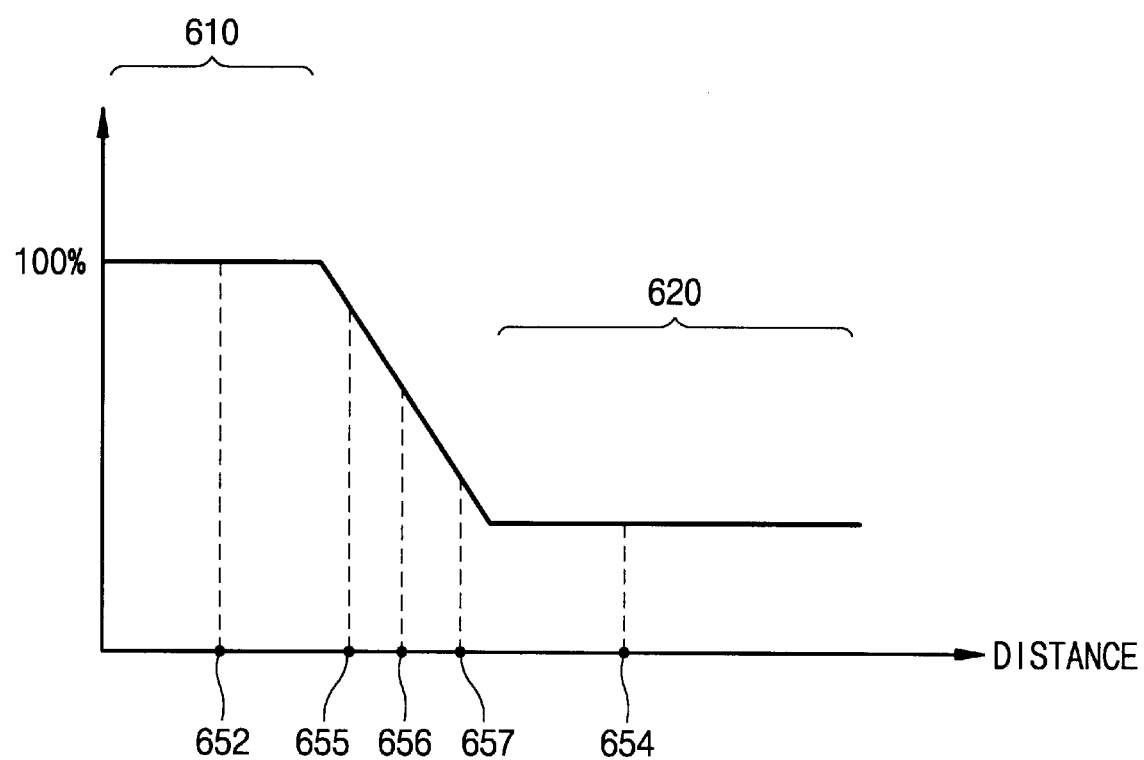
FIG. 6B is a diagram illustrating the difference in fractional content of conductive portion between a plate section and a plugs/mesh section of FIG. 6A.

Referring now also to FIG. 6B, a graph is shown to somewhat quantify the fact that plate section 610 has a higher fractional content of the conductive part than plugs/mesh section 620.

This fact is quantified by assuming in FIG. 6A a movable square test footprint 650. Test footprint 650 has an area larger than the average area of islands 630. It may be four, sixteen, or more times larger than the average area of islands 630.

If test footprint 650 is considered in plate section 610, it has a center point 652. If it is considered in plugs/mesh section 620, it has a center point 654. When centered on point 652 of plate section 610, test footprint 650 contains a higher fraction of the conductive part, than when centered on point 654 of plugs/mesh section 620.

If test footprint 650 is considered moved gradually from plate section 610 to plugs/mesh section 620, it may assume successively center points 655, 656, 657. In that case, the fractional content of the conductive part gradually decreases.

Returning to FIG. 6B, the horizontal axis indicates distance traversed by the center point of the movable test footprint 650, and the vertical axis the fractional content. Center points 652, 655, 656, 657, 654 are also shown, with their corresponding content. Within plate section 610 (point 652), the content is higher then within plugs/mesh section 620 (point 654). The value transitions along the border, as points 655, 656, 657 are traversed. If test footprint 650 is assumed large enough, the fractional content will not vary much within plugs/mesh section 620. And if it is assumed very large, the fractional content will not reach the full 100% value within plate section 610.

There is no requirement that plate section 610 have a full 100% value according to the invention. In other words, there is no requirement that plate section 610 be composed of wholly the conductive part. For example, plate section 610 may be separated by a small section of the non-conducting part. In other embodiments, there are more than one plate sections.

In addition, plate section 610 is shown as a square in FIG. 6A, but that is not necessarily the case for practicing the invention. Plate section 610 may well have other shapes according to the invention, such as being round, etc.

Referring now to both FIG. 6A and FIG. 5, plate section 610 is substantially the area that is occupied by plate 518b.

In any event, plate section 610 may be centered at bonding opening 530. In other embodiments, it is not so centered, as will become apparent from the particular sample embodiments described below. Furthermore, by "plugs/mesh" in this document it is meant either plugs or mesh, depending on the specific embodiment.

Figure 7:
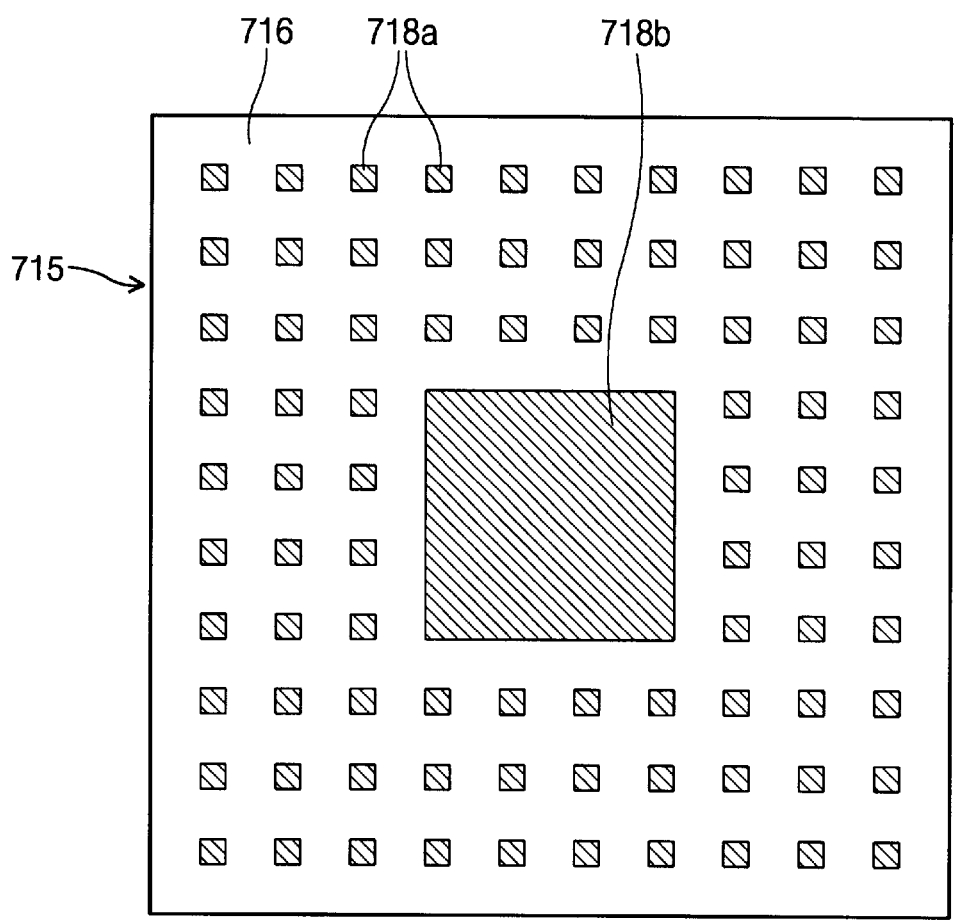
FIGS. 7, 8, 9, 10 show particular embodiments of the intermediate layer of FIG. 6A according to the invention.

Referring now to FIG. 7, intermediate layer 715 is a first particular embodiment of intermediate layer 515 of FIG. 6A. A non-conducting inter-metal dielectric (IMD) part 716 forms a background with openings for conductive plugs 718a, and a large plate 718b. It will be recognized that in this case, plugs 718a are equivalent to islands 630 of FIG. 6A. Plate 718b is in a plate section (not labeled individually), while IMD part 716 and plugs 718a are in a plugs/mesh section (not labeled individually).

Dimensions for the preferred embodiment of FIG. 7 are as follows. Intermediate layer 715 is a square whose side is about 90 μm long. Plate 718b is a square whose side is 60 μm long. Other dimensions are equivalently possible.

Figure 8:
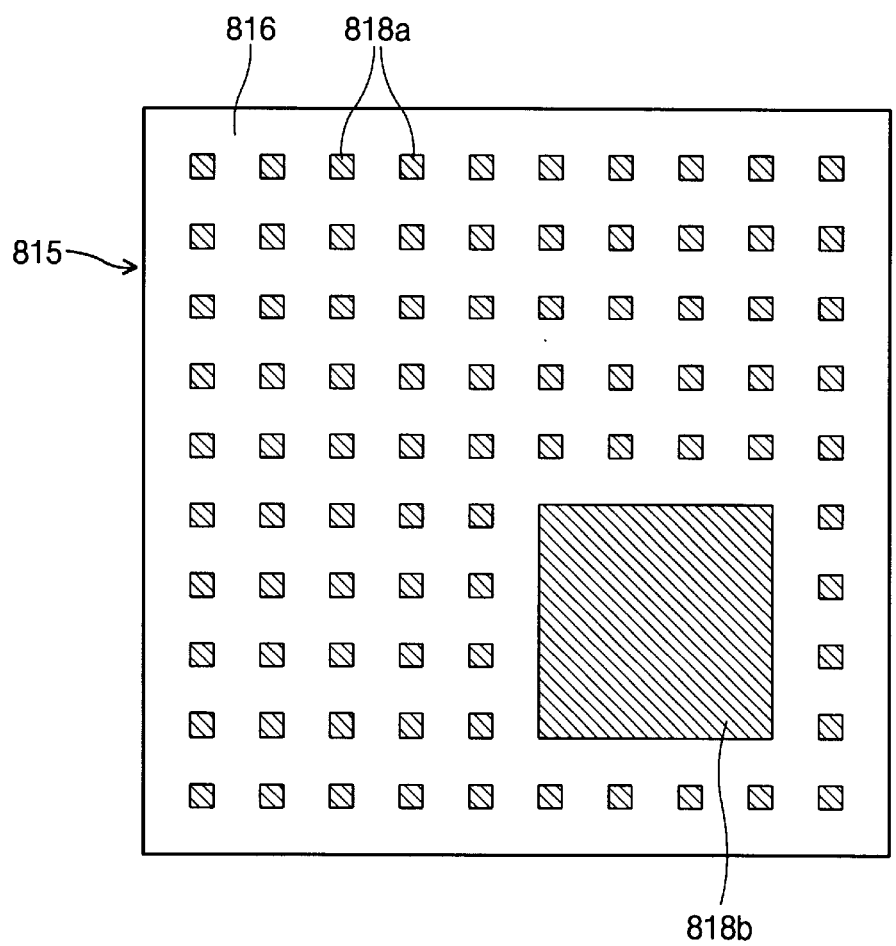

Referring now to FIG. 8, intermediate layer 815 is a second particular embodiment of intermediate layer 515 of FIG. 6A. Intermediate layer 815 is substantially similar to intermediate layer 715 of FIG. 7, in that it has an IMD part 816 with openings for conductive plugs 818a, and a large plate 818b. A difference is that plate 818b is off-center.

Figure 9:
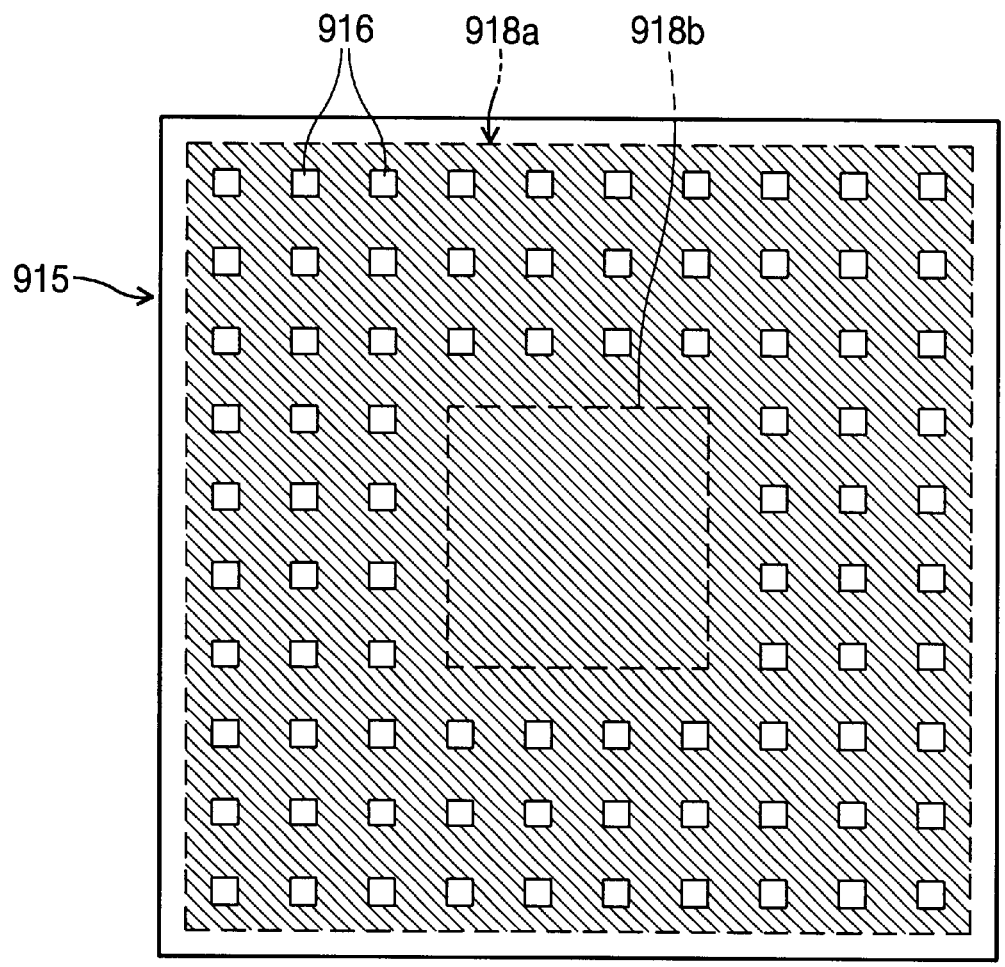

Referring now to FIG. 9, intermediate layer 915 is a third particular embodiment of intermediate layer 515 of FIG. 6A. A conductive mesh 918a forms a background with openings for islands of IMD 916. Conductive mesh 918a is continuous with a plate 918b. Plate 918b is in a plate section (not labeled individually), while mesh 918a openings for IMD parts 916 are in a plugs/mesh section (not labeled individually).

Figure 10:
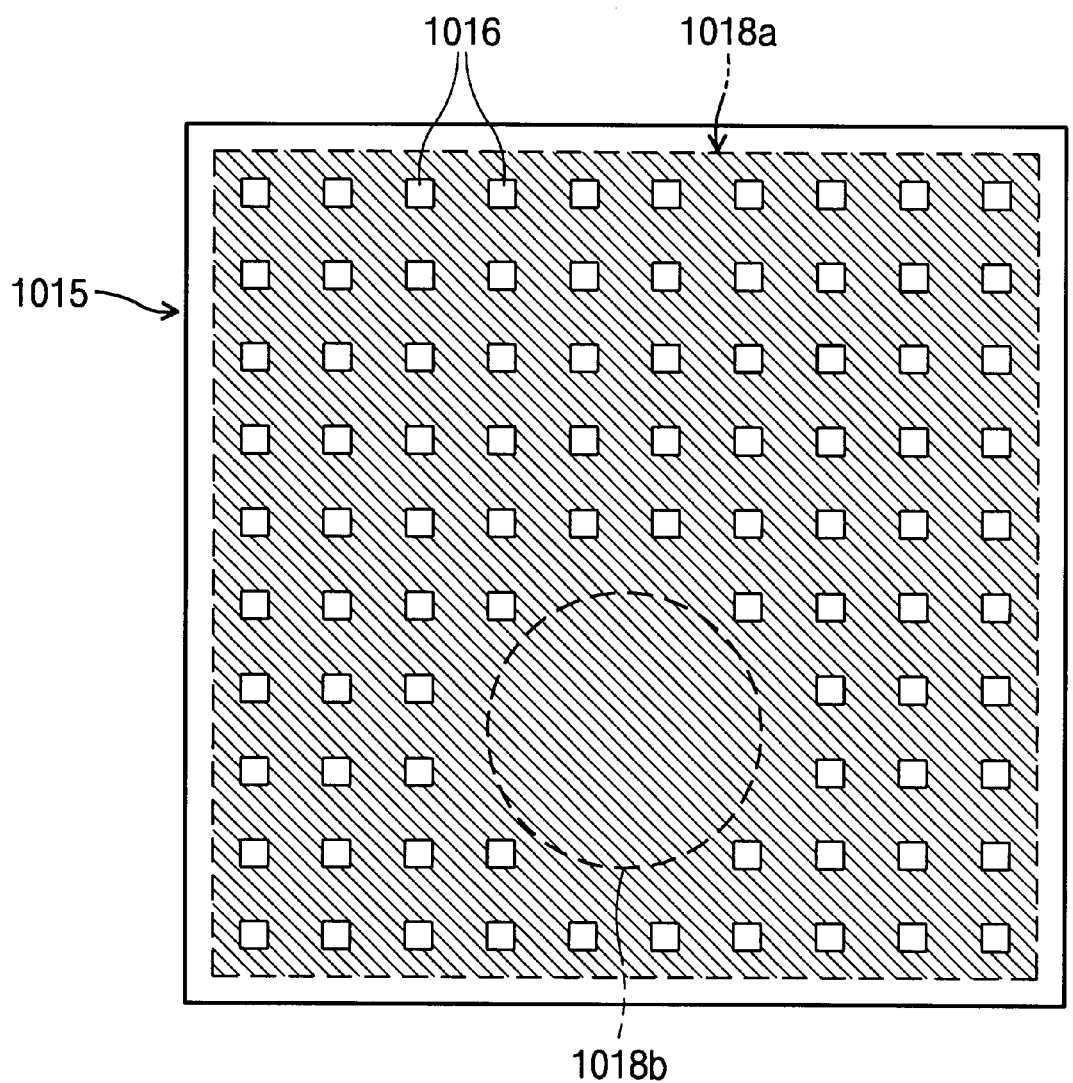

Referring now to FIG. 10, intermediate layer 1015 is a fourth particular embodiment of intermediate layer 515 of FIG. 6A. Intermediate layer 1015 is substantially similar to intermediate layer 915 of FIG. 9, in that it has a conductive mesh 1018a that forms a background with openings for islands of IMD 1016. Plus, conductive mesh 1018a is continuous with a plate 1018b. A difference is that plate 1018b is off-center, and round.

In the embodiments of FIGS. 7–10, the plate is not elongated, and not interrupted by any intermittent presence of the IMD part. Such is not necessary for practicing the invention, but preferred because such a shape better anticipates the shape of the possible scratch by test lead 140.

Where the plate is not elongated, another way to quantify it is to consider a round portion of it. A round portion of it that does not contain any of the IMD part may be larger than an indicative area of the features of the plugs/mesh portion (e.g. the average area of the islands).

A method of the invention will now be described, referring FIG. 11 and also FIGS. 12A, . . . 12H. The method of the invention may also be practiced to fabricate device 500.

FIG. 11 has a flowchart 1100, for illustrating steps of the method of the invention. FIGS. 12A, . . . 12H show the resulting successive stages, as the steps of flowchart 1100 are practiced.

Figure 12A:
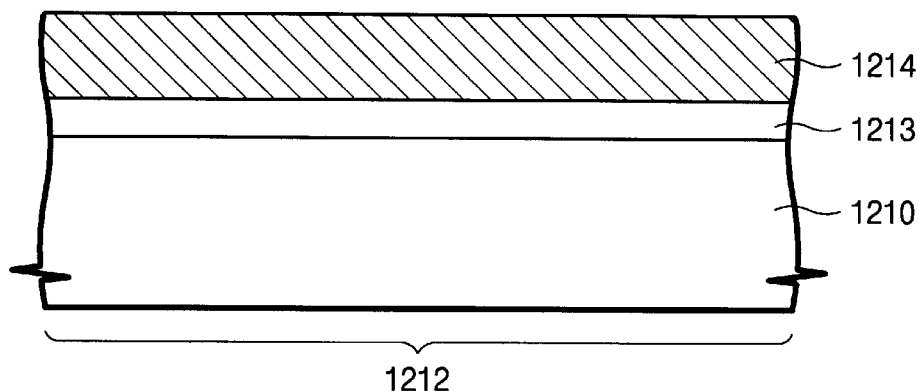
FIGS. 12A, . . . , 12H show successive snapshots of a bonding pad being fabricated according to the flowchart of FIG. 11.

Referring to FIG. 12A, an initial step of the method is to procure a substrate 1210, which may otherwise be used for an integrated circuit (IC). Substrate 1210 has a bonding area 1212.

Optionally, an inter-layer dielectric (ILD) layer 1213 is formed on substrate 1210 at bonding area 1212. ILD layer 1213 may be formed of a silicon oxide layer, such as a borophosphosilicate glass (BPSG) layer, or a PETEOS (plasma-induced tetra-ethyl-orthosilicate).

According to a step 1110 (of FIG. 11) and also to FIG. 12A, a first conducting layer 1214 is formed at bonding area 1212 of semiconductor substrate 1210. If ILD layer 1213 has been formed first, then first conducting layer 1214 is formed on ILD layer 1213.

First conducting layer 1214 is preferably made as a metal pad 1214, by forming a metal layer, and then patterning to form the metal pad 1214. Metal layer 1214 may be from any suitable material, such as an aluminum layer, an aluminum alloy layer, a tungsten layer, a tungsten silicide layer, etc. Alternately, metal layer 1214 may be formed by sequentially stacking a barrier metal layer, an aluminum layer, and an anti-reflective layer.

Figure 12B:
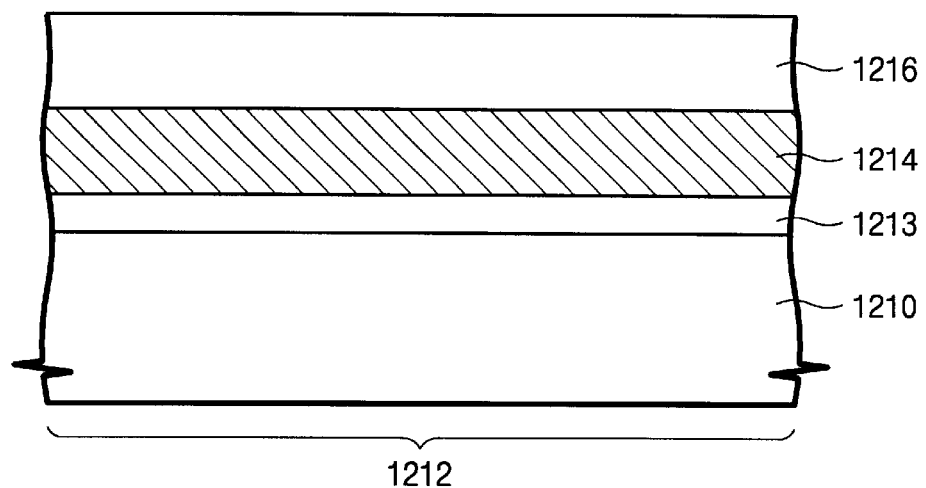

According to a next step 1120 (of FIG. 11) and also to FIG. 12B, an inter-metal dielectric (IMD) layer 1216 is formed on first conducting layer 1214.

Figure 12C:
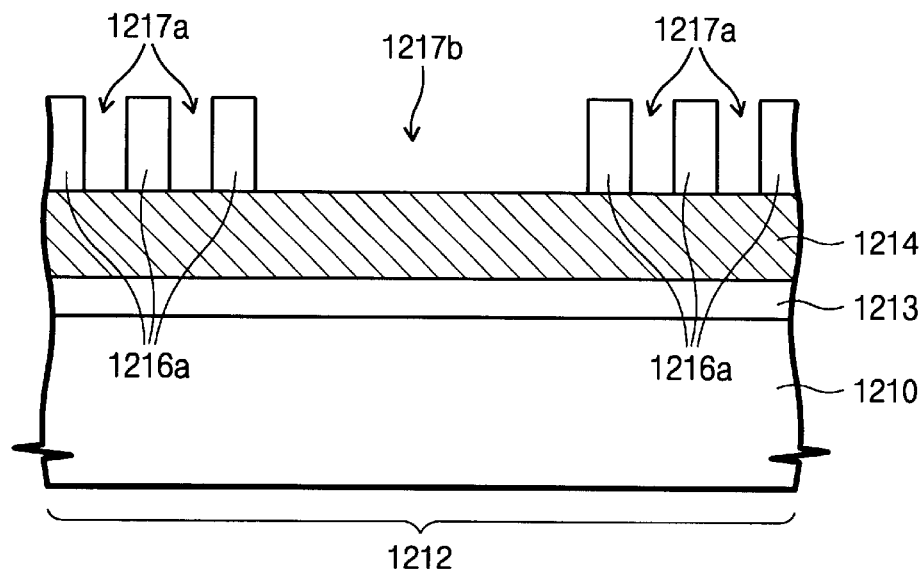

According to a next step 1130 (of FIG. 11) and also to FIG. 12C, IMD layer 1216 is patterned and etched to form at least one IMD portion 1216a. More particularly, patterning and etching is such that a plate section 1217b is cleared fully from IMD layer 1216, and further a plugs/mesh section 1217a is cleared intermittently.

The resulting plate section 1217b and plugs/mesh section 1217a have a special hybrid pattern according to the invention. The actual hybrid pattern shown in FIG. 12C is just one embodiment, where there are many IMD islands 1216a. Alternately, plugs/mesh section 1217a is formed as openings cleared from IMD layer 1216. Or portions of both are used.

In general, the hybrid pattern is the same as described with reference to FIG. 6A and its attendant description. In other words, the plugs/mesh section contains a plurality of islands of either the cleared part or the non-cleared part. The islands are interspersed with at least one portion of the other one of the cleared part and the non-cleared part. Again, a square test footprint may be considered, that generally has a larger area than the islands. For example, the area may be four or sixteen times the average area of the islands. When the square test footprint is considered in the plate section it contains a higher fraction of the cleared part, than if considered in the plugs/mesh section.

And again, plate section 1217b may be centered at bonding pad 1212, as is preferred. Alternately, plate section 1217b is not centered at bonding pad 1212.

Figure 12D:
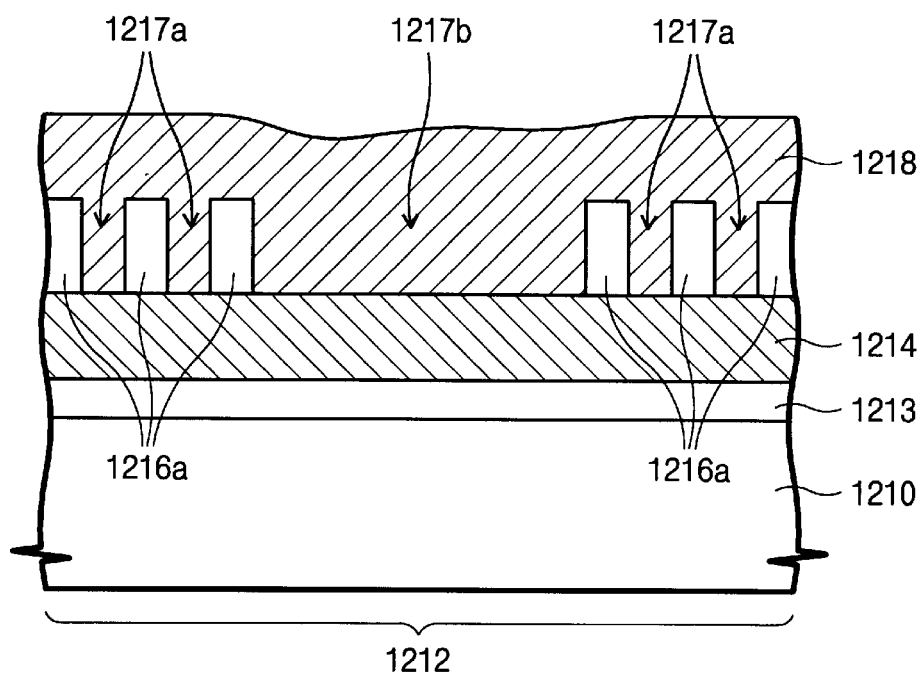

According to a next step 1140 (of FIG. 11) and also to FIG. 12D, a second conducting layer 1218 is formed over the resulting pattern. Layer 1218 may be made from a metal, such as tungsten, aluminum, etc.

Second conducting layer 1218 fills the cleared plate section 1217b and cleared plugs/mesh section 1217a. This way, particular features are formed around IMD islands 1216a, using these islands as a mold. Since the features in the cleared plugs/mesh section 1217a are of small size, tungsten is preferred to aluminum for better filling.

Beyond filling these sections 1217a and 1217b, however, layer 1218 may be partly protruding higher from IMD islands 1216a, while still connected to all the molded features. In that case, layer 1218 forms a unitary piece.

Figure 12E:
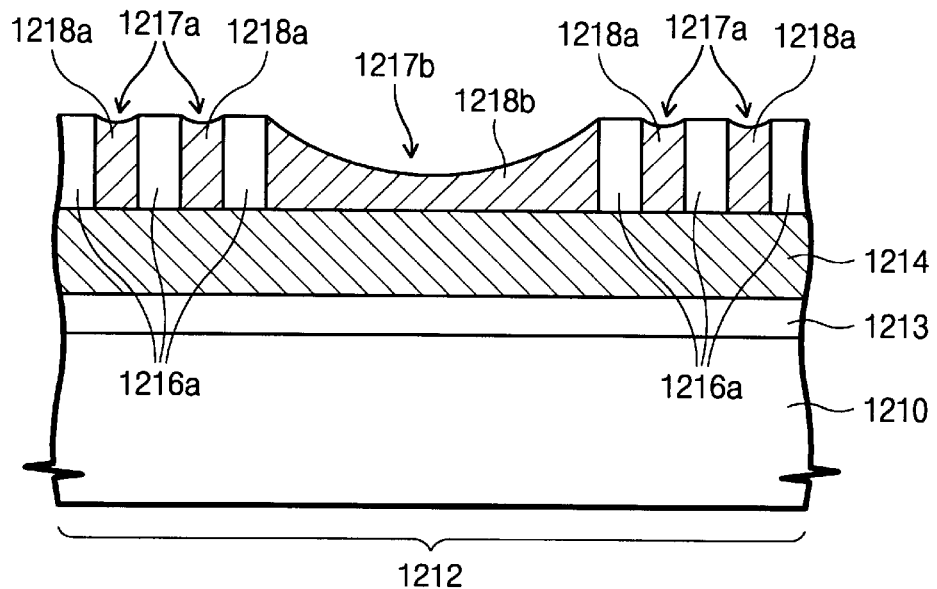

According to an optional next step 1150 (of FIG. 11) and also to FIG. 12E, layer 1218 is planarized. Preferably this is performed by Chemical Mechanical Polishing (CMP) the protruding second conducting metal layer. The IMD portion, in this case IMD islands 1216a, acts as a stop to the CMP process. Accordingly, the IMD portion becomes exposed, but the first conducting layer 1214 does not become exposed.

After planarizing, only the molded features remain. In other words, the CMP process leaves a plate 1218b in the cleared plate section 1217b, and plugs/mesh in the cleared plugs/mesh section 1217a. These may or may not still be a unitary piece, depending on the particular embodiment (mesh or plugs).

As can be seen from FIG. 12E, the CMP process consumes layer 1218 deeper than the stops (in this case, IMD islands 1216a), due to a dishing phenomenon. It does not consume layer 1218 very deeply in the plugs/mesh section 1217a, because the features are not very large (the openings are not very wide).

An important advantage of the invention is that, notwithstanding the dishing phenomenon, the CMP process further does not consume through plate 1218b, because its area is also limited. Accordingly, enough of plate 1218b remains, and first conducting layer 1214 does not become exposed.

Figure 12F:
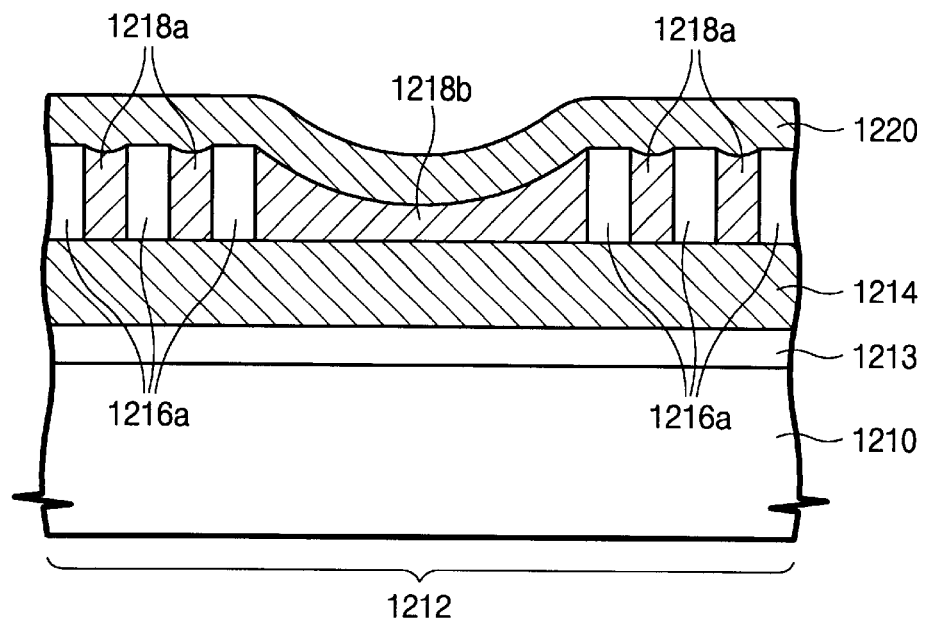

According to a next step 1160 (of FIG. 11) and also to FIG. 12F, a third conducting layer 1220 is formed over the resulting pattern. Preferably third conducting layer 1220 is formed as a metal layer, and patterned to form a metal pad 1220. The metal layer, such as an aluminum layer, an aluminum alloy layer, a tungsten layer, or a tungsten silicide layer. Alternately, metal pad 1220 may be formed by sequentially stacking a barrier metal layer, an aluminum layer, and an anti-reflective layer.

Third conducting layer 1220 is formed such that it does not physically contact first conducting layer 1214. This is an advantage of the invention, since the planarizing process has not consumed entirely either the IMD part or the conductive part at any place above first conducting layer 1214.

Third conducting layer 1220 is electrically connected to first conducting layer 1214 through the conductive portions 1218a, 1218b. These have the special configuration of FIG. 6A, as described above.

Figure 12G:
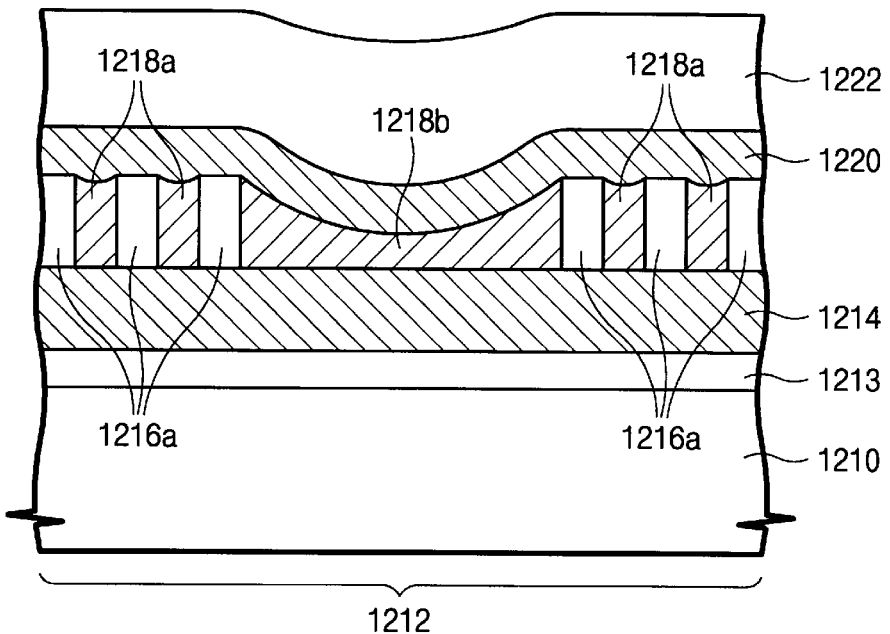

According to an optional next step 1170 (of FIG. 11) and also to FIG. 12G, a passivation layer 1222 is formed over the resulting structure.

Figure 12H:
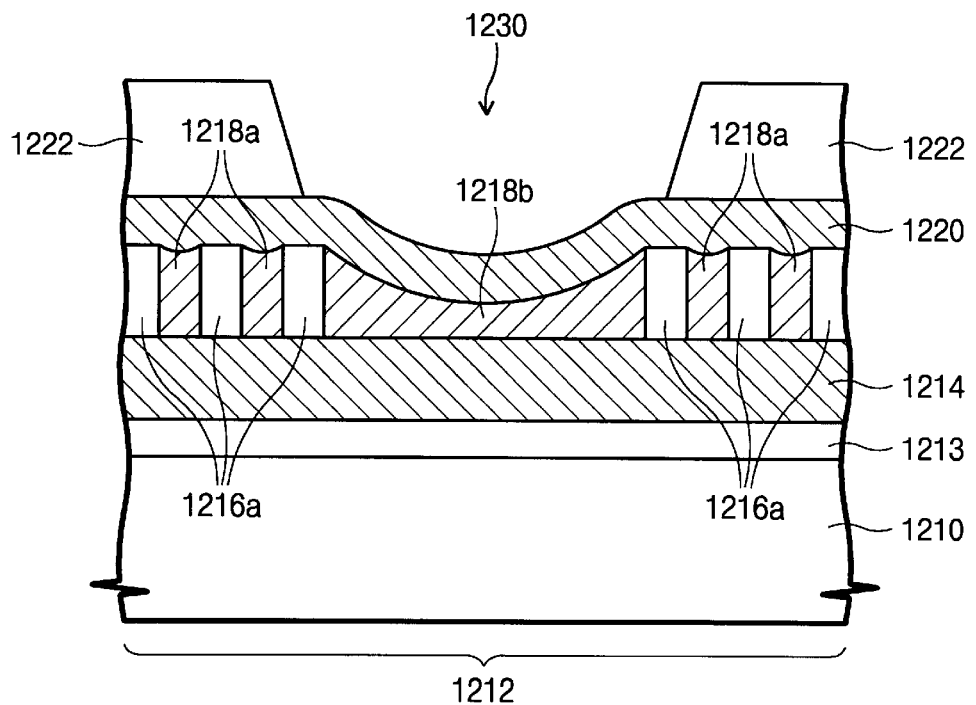

According to an optional next step 1180 (of FIG. 11) and also to FIG. 12H, a bonding opening 1230 is created in passivation layer 1222. Plate 1218b may be centered at bonding opening 1230, as is preferred. Alternately, plate 1218b is not centered at the bonding opening 1230.

After these steps, and maybe others, the bonding pad itself has been fabricated. Subsequent processes are for electrical testing of the circuit on the chip and for packaging of the whole device.

Figure 13A:
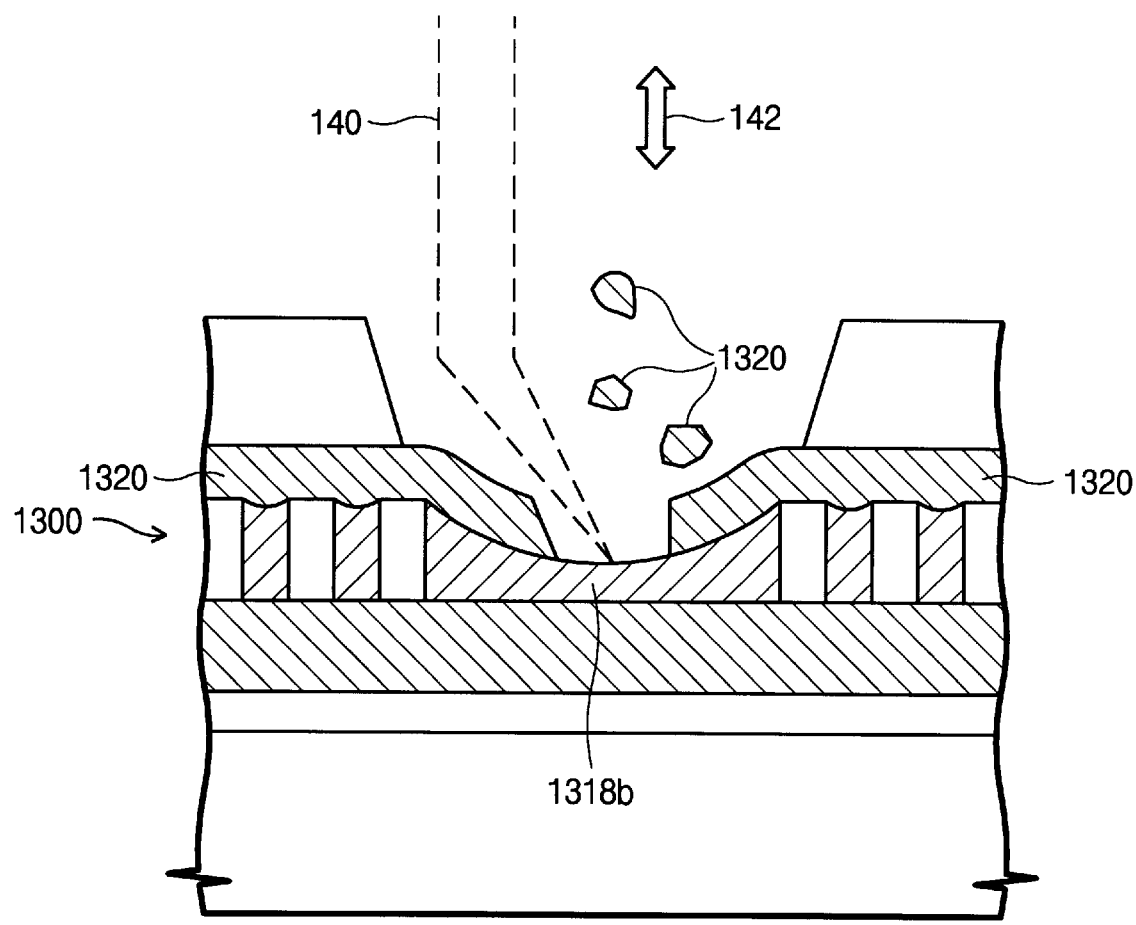
FIG. 13A shows a scratching hazard in testing the device of FIG. 5 or of FIG. 12H.

Referring now to FIG. 13A, a bonding pad 1300 is shown made according to an embodiment of the invention. Pad 1300 may be the same as the bonding pad of device 500, or the pad of FIG. 12H.

Figure 1A:
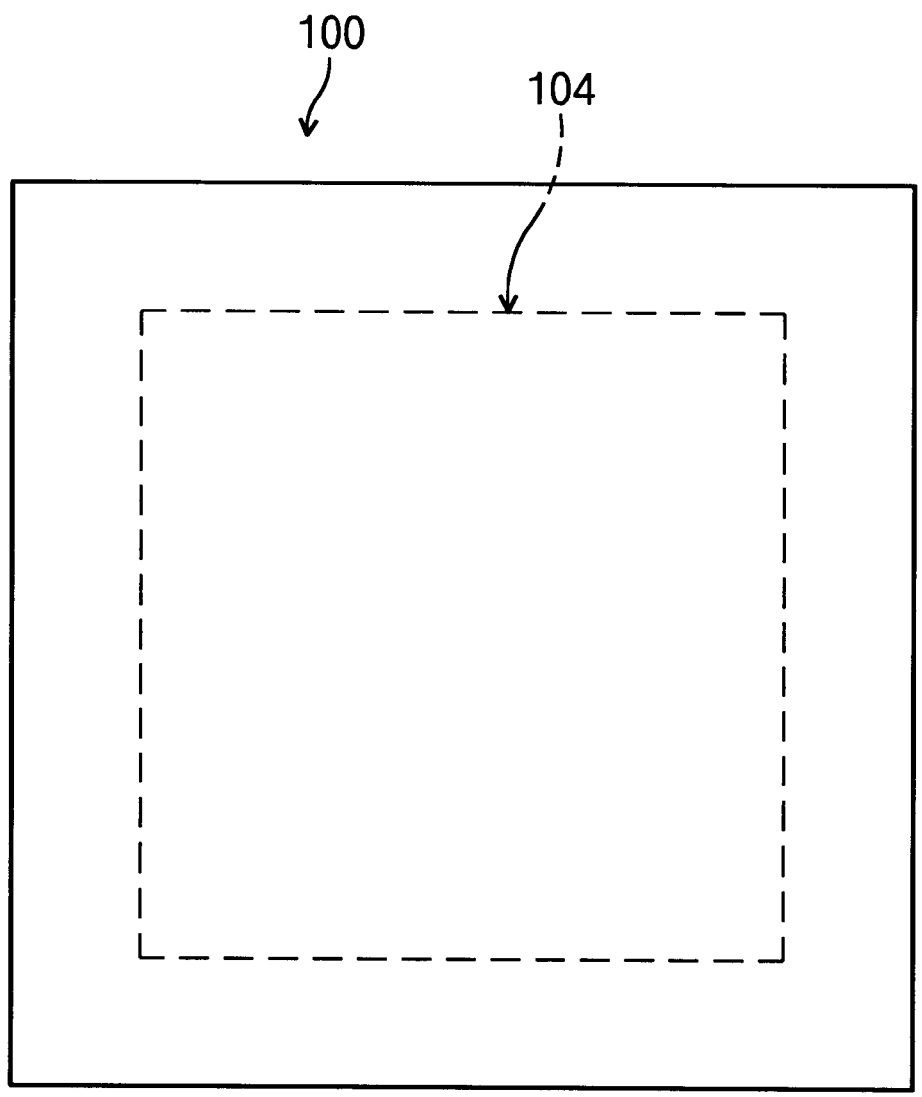
FIG. 1A is a top view of a bonding pad in the prior art
Figure 1B:
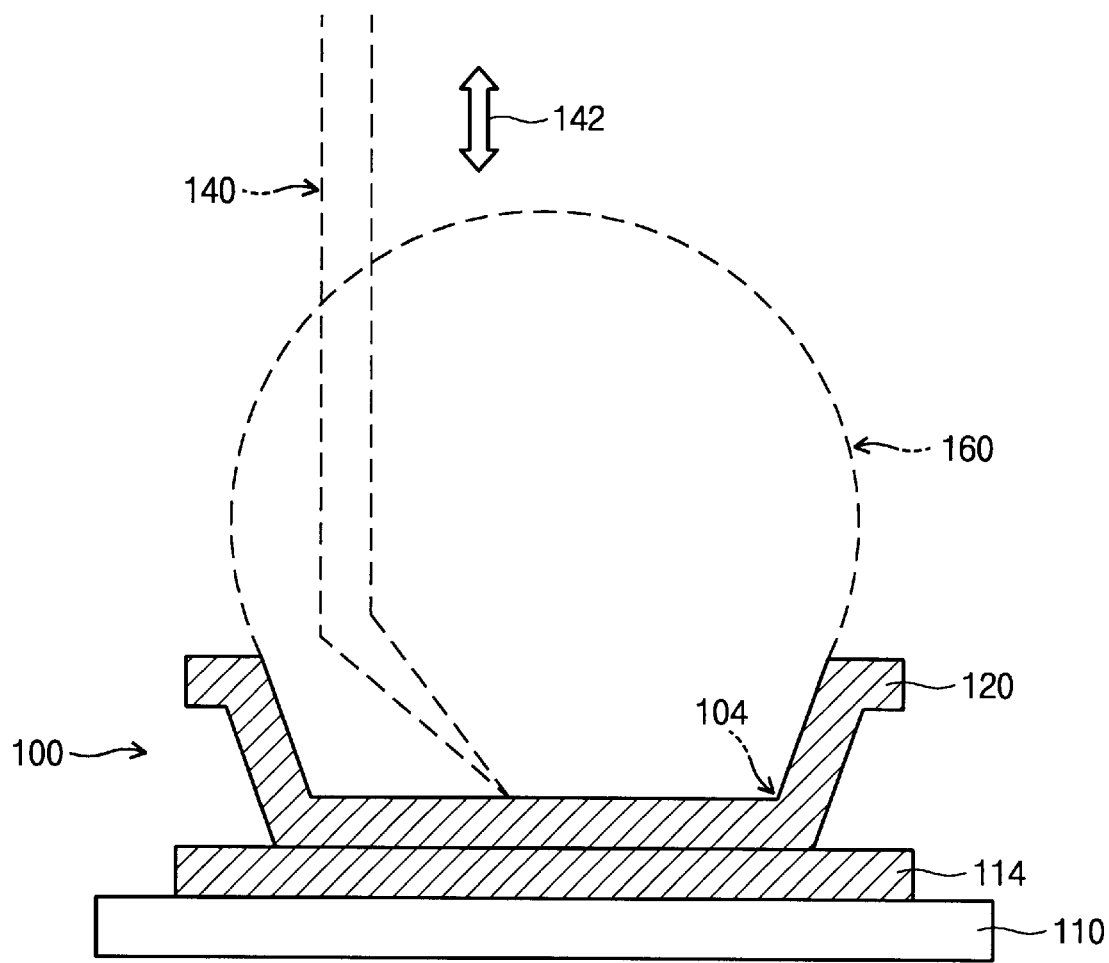
FIG. 1B is a section view of the bonding pad of FIG. 1A.
Figure 2A:
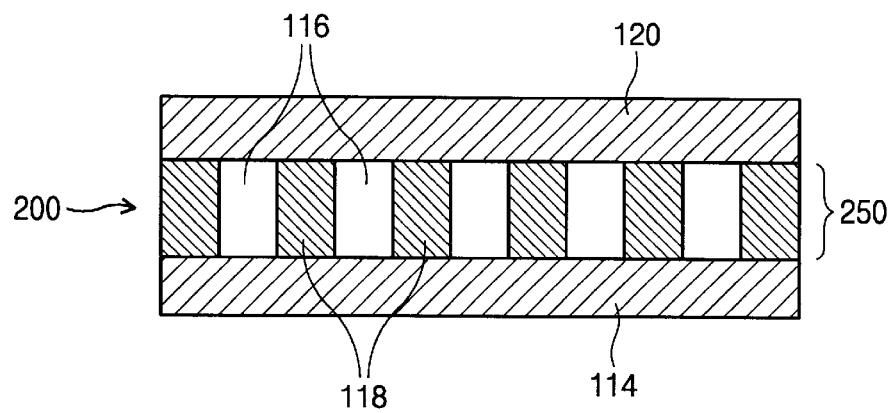
FIG. 2A is a section view of another bonding pad in the prior art
Figure 2B:
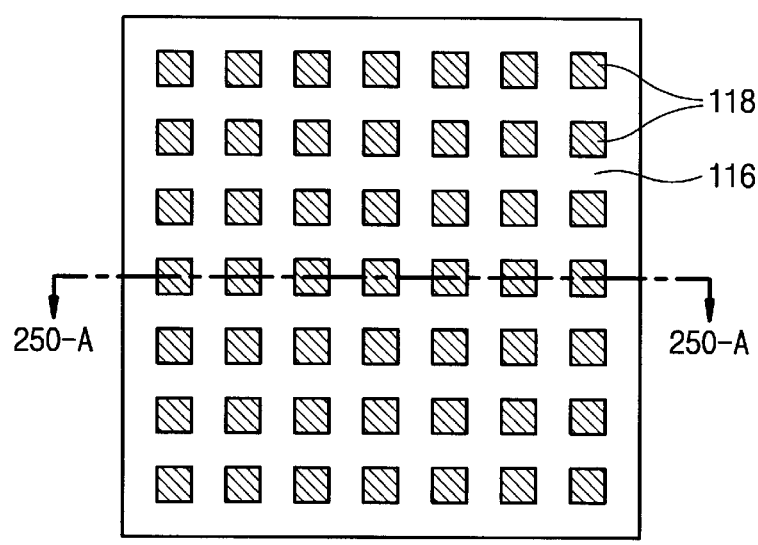
FIG. 2B is a first prior art implementation of an alternating intermediate layer of the bonding pad of FIG. 1A.
Figure 2C:
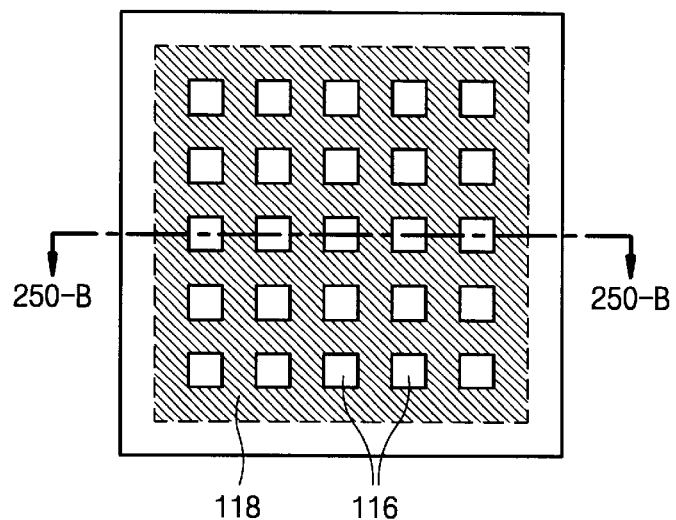
FIG. 2C is a second prior art implementation of an alternating intermediate layer of the bonding pad of FIG. 1A.
Figure 3A:
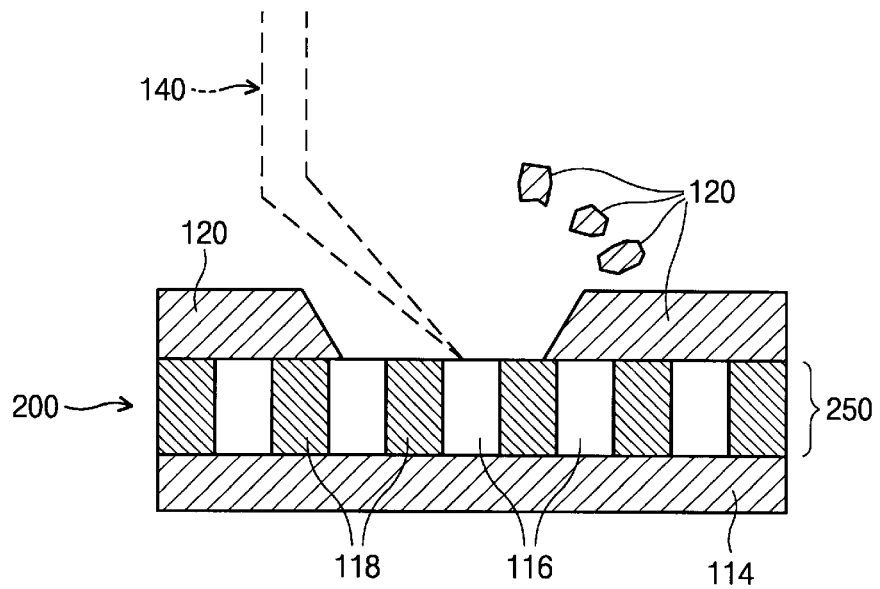
FIG. 3A shows a scratching hazard in testing the device of FIG. 2A.
Figure 3B:
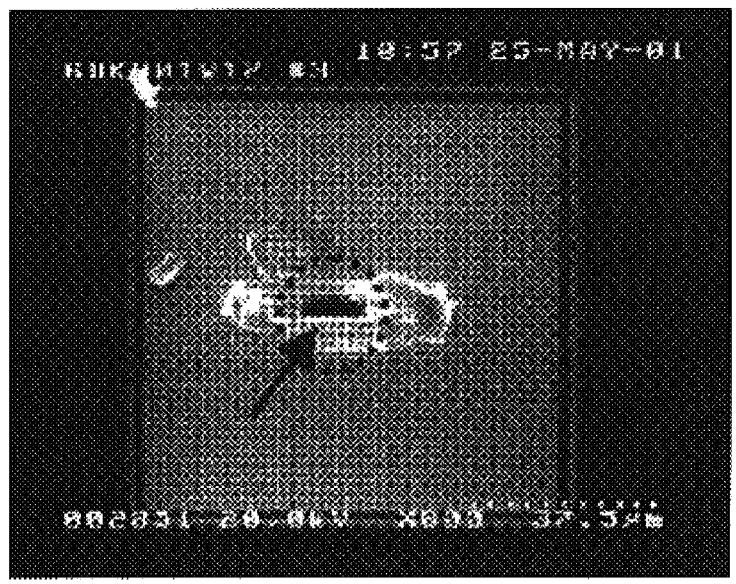
FIG. 3B is an actual photograph of the scratched device of FIG. 3A.
Figure 3C:
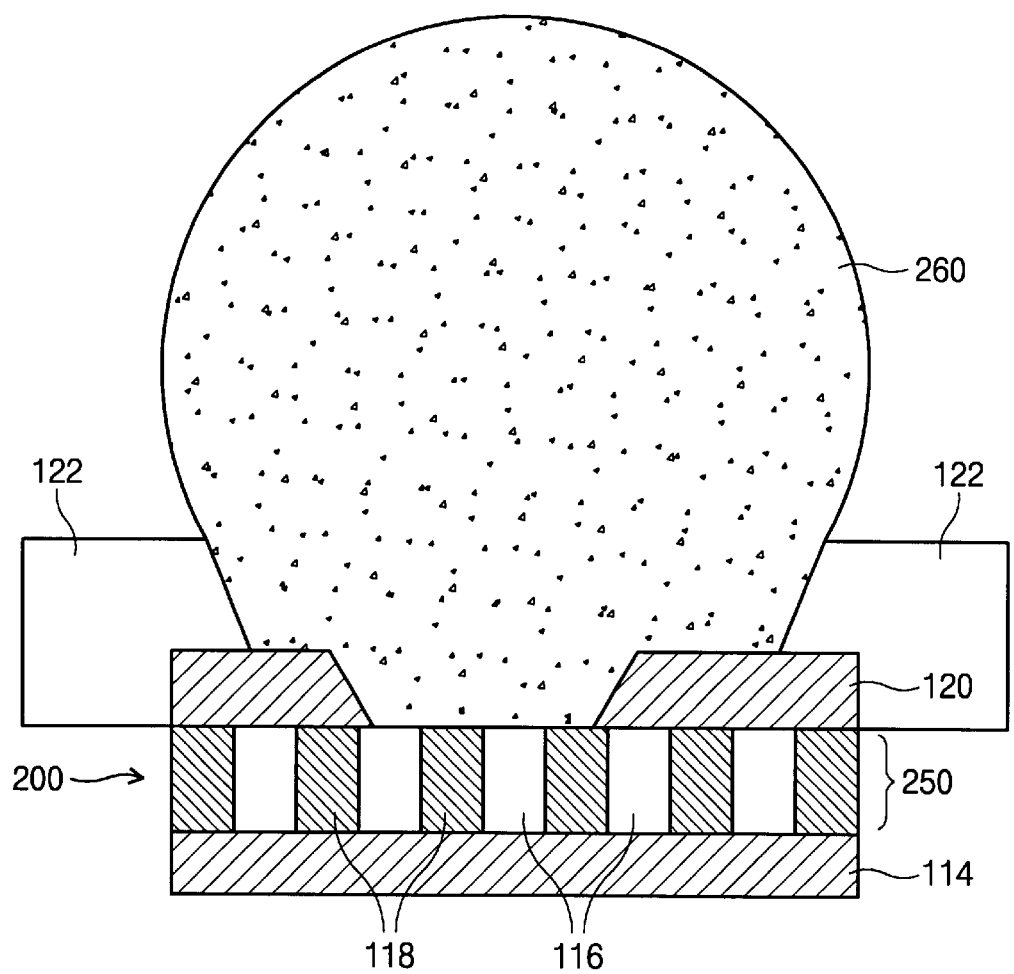
FIG. 3C shows a next step in the packaging of the scratched device of FIG. 3A, by depositing a bump.

Pad 1300 is shown tested by EDS probe 140, similarly to FIG. 3A. A hazard is that an lead 140, moving along the direction of arrow 142, may scratch off pieces 1320 of a top layer 1320. As can be seen, even if scratching happens, only a plate 1318b will be exposed. None of the IMD portion need be exposed.

Figure 13B:
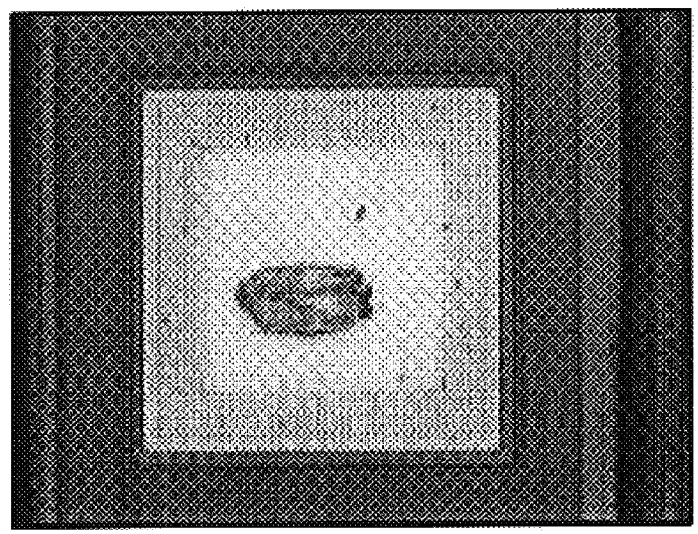
FIG. 13B is an actual photograph of the scratched device of FIG. 13A.

Referring now to FIG. 13B, a photograph of a top view of bonding pad 1300 is shown, after being scratched as in FIG. 13A. Notwithstanding the scratch, bonding pad 1300 is better than the prior art, as contrasted to the photograph of FIG. 3A.

Figure 3D:
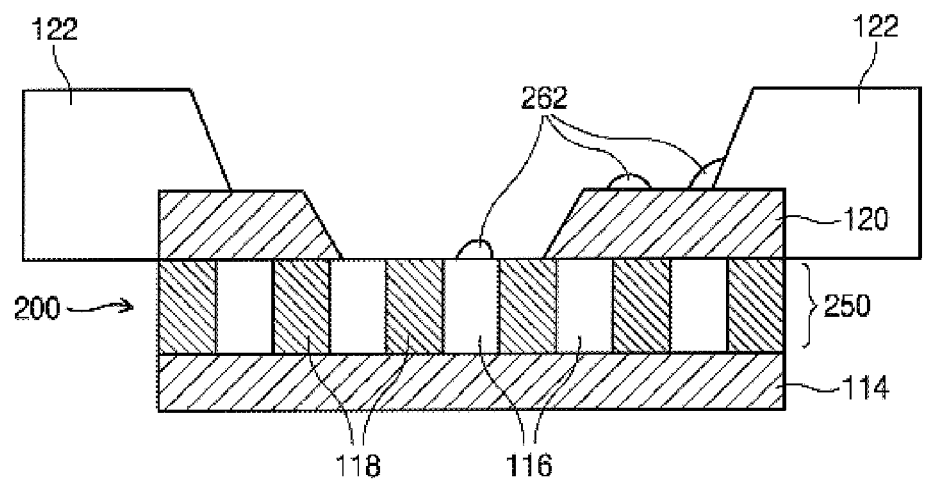
FIG. 3D shows a bump lifting hazard for the device of FIG. 3C.
Figure 3E:
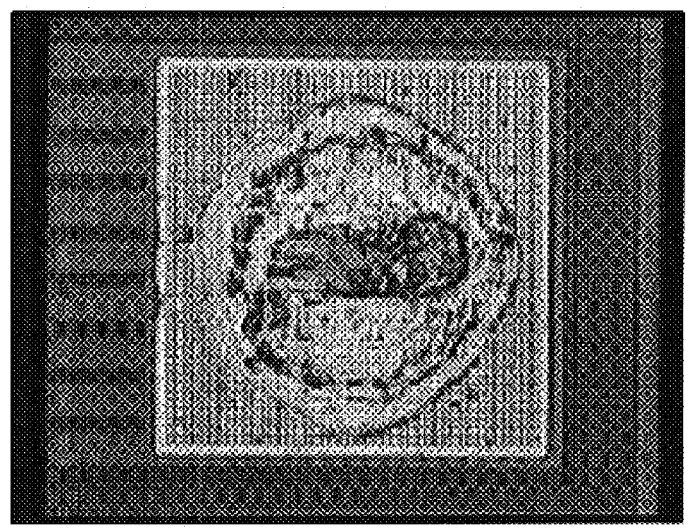
FIG. 3E is a photograph of the device of FIG. 3D.
Figure 4:
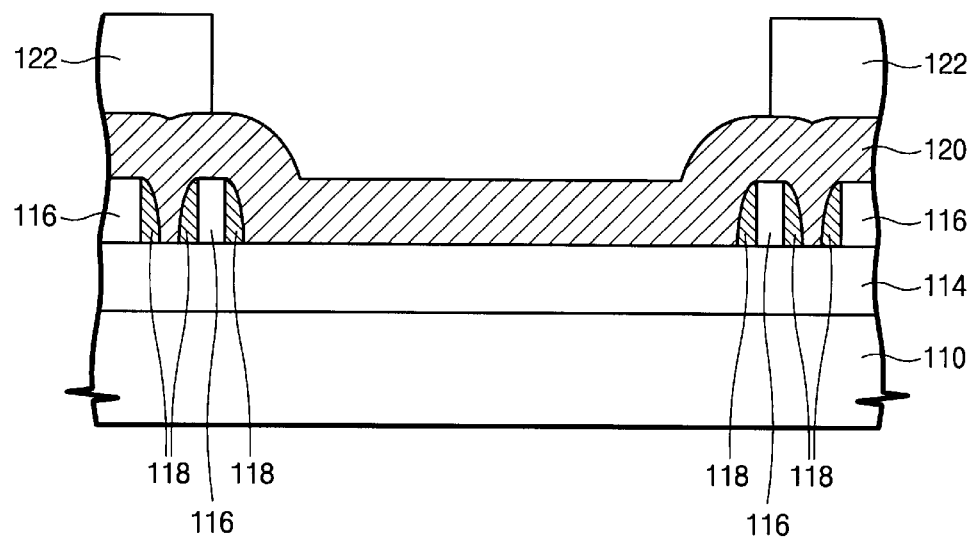
FIG. 4 is a diagram of another device in the prior art.
Figure 14A:
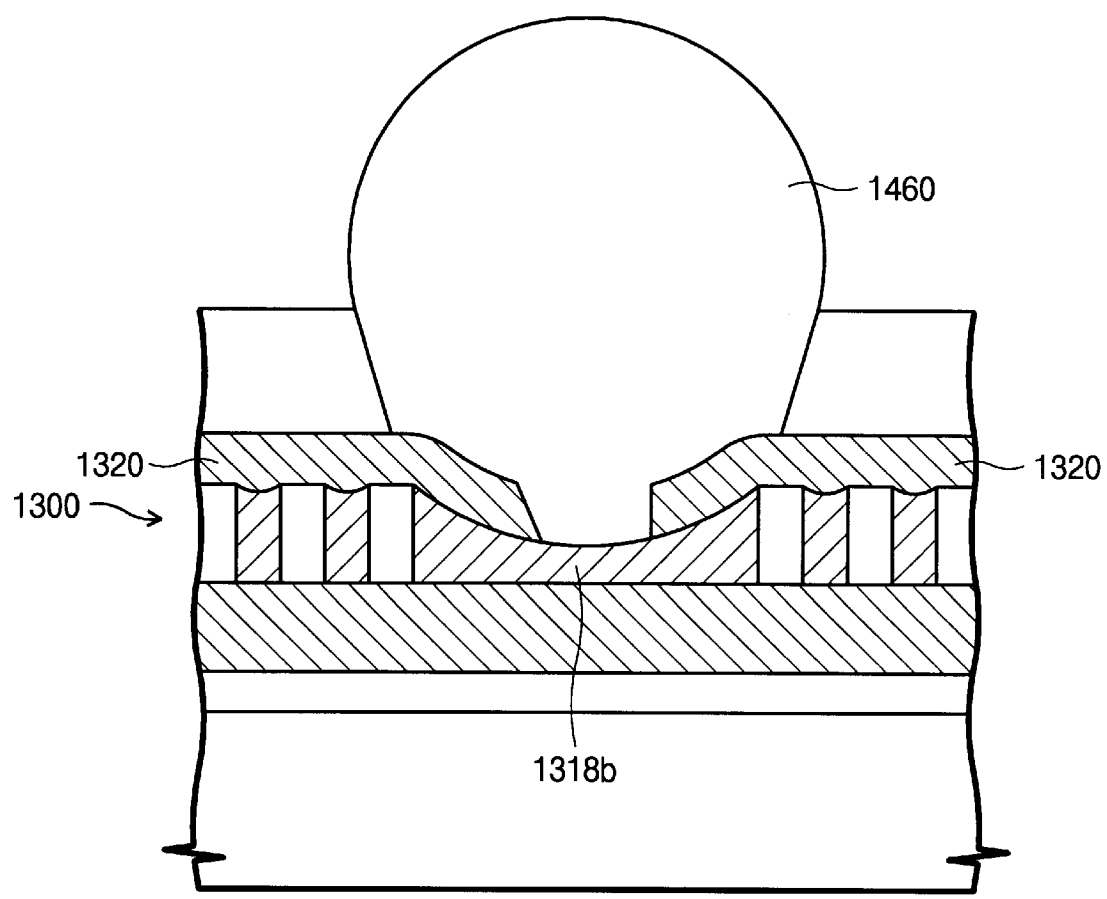
FIG. 14A shows a bonding step for the scratched bonding pad of FIG. 13A.

Referring now to FIG. 14A, a subsequent step is to actually bond a bump 1460 to bonding pad 1300. Bonding pad 1300 has strong adhesion, because it makes contact with metal plate 1318. This reduces substantially the lifting hazard of the prior art, which was described with reference to FIG. 3D.

Figure 14B:
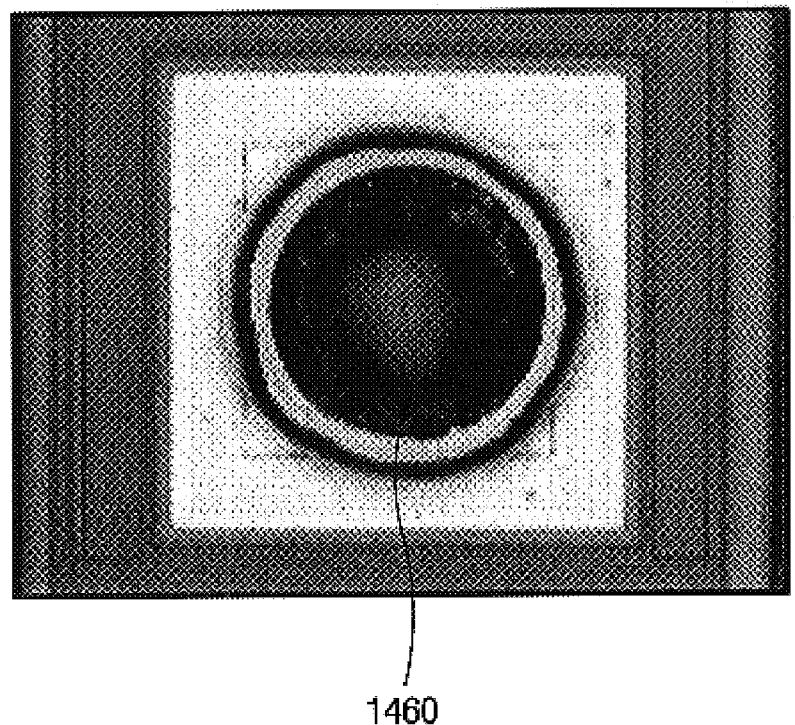
FIG. 14B is a photograph illustrating the device of FIG. 14A.

Referring now to FIG. 14B, a photograph of a top view of bonding pad 1300 is shown. Bump 1460 has not been lifted.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

In the attached drawings, the thickness of layers and regions may be exaggerated for clarity. Moreover, when it is mentioned that a layer is on another layer or on a substrate, the layer in question may be formed directly on the other layer or on the substrate, or a third layer may be interposed therebetween.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and sub-combinations of features, functions, elements and/or properties may be presented in this or a related document.

The invention claimed is:

1. A semiconductor device comprising:
 a semiconductor substrate having a bonding area;
 a first conducting layer on the bonding area;
 an intermediate layer on the first conducting layer, the intermediate layer including a non-conducting part and a conductive part arranged in a plate section and a plugs/mesh section of the intermediate layer such that:
  the plugs/mesh section contains a plurality of islands of one of the conductive part and the non-conducting part interspersed with at least one portion of the other one of the conductive part and the non-conducting part, and
  a square test footprint having an area at least four times an average of areas of the islands contains a higher fraction of the conductive part if considered in the plate section, than if considered in the plugs/mesh section; and
 a top conductive layer on the intermediate layer that does not physically contact the first conducting layer.

2. The device of claim 1, in which
the plate section contains a portion of only the conductive part.

3. The device of claim 1, in which
the square test footprint has an area of at least 16 times the island area.

4. The device of claim 1, in which
the plate section is centered in the bonding area.

5. The device of claim 1, in which
the plate section is not centered in the bonding area.

6. The device of claim 1, in which
the conductive part of the intermediate layer includes one of copper and tungsten.

7. The device of claim 1, further comprising:
a passivation layer having a bonding opening, and in which the plate section is centered at the bonding opening.

8. The device of claim 1, further comprising:
a passivation layer having a bonding opening,
and in which the plate section is not centered at the bonding opening.

9. A semiconductor device comprising:
 a semiconductor substrate having a bonding area;
 a first conducting layer on the bonding area;
 an intermediate layer on the first conducting layer, the intermediate layer including a plate made wholly from a conductor, and conductive plugs surrounded by a dielectric which further surrounds the plate, in which a round portion of the plate has an area at least ten times an average area of the plugs; and
 a top conductive layer on the intermediate layer that does not physically contact the first conducting layer.

10. The device of claim 9, in which
the plate is made from one of copper and tungsten.

11. The device of claim 9, further comprising:
a passivation layer having a bonding opening, and in which the plate is centered at the bonding opening.

12. The device of claim 9, further comprising:
a passivation layer having a bonding opening,
and in which the plate is not centered at the bonding opening.

13. The device of claim 9, in which
the round portion of the plate has an area at least twenty times an average area of the plugs.

14. A semiconductor device comprising:
 a semiconductor substrate having a bonding area;
 a first conducting layer on the bonding area;
 an intermediate layer on the first conducting layer, the intermediate layer including a conductive part that defines a plate section and intermittent openings around the plate section, the intermediate layer further including a non-conducting part in the openings, in which a round portion of the plate section has none of the non-conducting part and an area at least ten times an average area of the intermittent openings; and
 a top conductive layer on the intermediate layer that does not physically contact the first conducting layer.

15. The device of claim 14, in which
the conductive part is made from one of copper and tungsten.

16. The device of claim 14, further comprising:
a passivation layer having a bonding opening,
and in which the plate section is centered at the bonding opening.

17. The device of claim 14, further comprising:
a passivation layer having a bonding opening,
and in which the plate section is not centered at the bonding opening.

18. The device of claim 14, in which
the round portion of the plate section has an area at least twenty times an average area of the intermittent openings.

19. A method comprising:
 forming a first conducting layer at a bonding area of a semiconductor substrate;
 forming an Inter Metal Dielectric (IMD) layer on the first conducting layer;
 patterning and etching the IMD layer to form at least one IMD portion by clearing fully a plate section and intermittently a plugs/mesh section of the IMD layer at the bonding area, such that:
  the plugs/mesh section contains a plurality of islands of one of the cleared part the non-cleared part interspersed with at least one portion of the other one of the cleared part and the non-cleared part, and a square test footprint having an area at least four times an average area of the islands contains a higher fraction of the cleared part if considered in the plate section, than if considered in the plugs/mesh section;

forming a second conducting layer to fill the cleared plate section and plugs/mesh section; and forming a third conducting layer on the second conducting layer, such that the third conducting layer does not contact the first conducting layer.

20. The method of claim 19, in which
the square test footprint has an area at least sixteen times an average area of the islands.

21. The method of claim 19, in which
the second conducting layer is made from one of tungsten and copper.

22. The method of claim 19, in which
the plate section is centered in the bonding area.

23. The method of claim 19, in which
the plate section is not centered in the bonding area.

24. The method of claim 19, further comprising:
forming a passivation layer; and
creating a bonding opening in the passivation layer,
and in which the plate section is centered at the bonding opening.

25. The method of claim 19, further comprising:
forming a passivation layer; and
creating a bonding opening in the passivation layer,
and in which the plate section is not centered at the bonding opening.

26. The method of claim 19, further comprising:
planarizing the second conducting layer.

27. The method of claim 26, in which
planarizing includes performing chemical mechanical polishing such that
the IMD portion becomes exposed, but
the first conducting layer does not become exposed.

28. A method comprising:
forming a first conducting layer at a bonding area of a semiconductor substrate;
forming an Inter Metal Dielectric (IMD) layer on the first conducting layer;
patterning and etching the IMD layer to clear fully a plate section of the IMD layer at the bonding area and to clear around islands in a plugs/mesh section of the IMD layer at the bonding area, such that a round portion in the cleared plate section has an area at least ten times an average area of the islands;
forming a second conducting layer to fill the cleared plate section and plugs/mesh section; and
forming a third conducting layer on the second conducting layer, such that the third conducting layer does not contact the first conducting layer.

29. The method of claim 28, in which
the round portion has an area at least twenty times an average area of the intermittent openings.

30. The method of claim 28, in which
the second conducting layer is made from one of tungsten and copper.

31. The method of claim 28, in which
the plate section is centered in the bonding area.

32. The method of claim 28, in which
the plate section is not centered in the bonding area.

33. The method of claim 28, further comprising:
forming a passivation layer; and
creating a bonding opening in the passivation layer,
and in which the plate section is centered at the bonding opening.

34. The method of claim 28, further comprising:
forming a passivation layer; and
creating a bonding opening in the passivation layer,
and in which the plate section is not centered at the bonding opening.

35. The method of claim 28, further comprising:
planarizing the second conducting layer.

36. The method of claim 35, in which
planarizing includes performing chemical mechanical polishing such that
the IMD portion becomes exposed, but
the first conducting layer does not become exposed.

37. A method comprising:
forming a first conducting layer at a bonding area of a semiconductor substrate;
forming an Inter Metal Dielectric (IMD) layer on the first conducting layer;
patterning and etching the IMD layer to clear fully a plate section of the IMD layer at the bonding area and to clear intermittent openings in a plugs/mesh section of the IMD layer at the bonding area, such that a round portion in the cleared plate section has an area at least ten times an average area of the intermittent openings;
forming a second conducting layer to fill the cleared plate section and plugs/mesh section; and
forming a third conducting layer on the second conducting layer, such that the third conducting layer does not contact the first conducting layer.

38. The method of claim 37, in which
the round portion has an area at least twenty times an average area of the intermittent openings.

39. The method of claim 37, in which
the second conducting layer is made from one of tungsten and copper.

40. The method of claim 37, in which
the plate section is centered in the bonding area.

41. The method of claim 37, in which
the plate section is not centered in the bonding area.

42. The method of claim 37, further comprising:
forming a passivation layer; and
creating a bonding opening in the passivation layer,
and in which the plate section is centered at the bonding opening.

43. The method of claim 37, further comprising:
forming a passivation layer; and
creating a bonding opening in the passivation layer,
and in which the plate section is not centered at the bonding opening.

44. The method of claim 37, further comprising:
planarizing the second conducting layer.

45. The method of claim 44, in which
planarizing includes performing chemical mechanical polishing such that
the IMD portion becomes exposed, but
the first conducting layer does not become exposed.

* * * * *